(12) United States Patent
Shalaev et al.

(10) Patent No.: US 12,332,405 B2
(45) Date of Patent: Jun. 17, 2025

(54) SYSTEMS AND METHODS FOR SINGLE-PHOTON EMISSION

(71) Applicant: Purdue Research Foundation, West Lafayette, IN (US)

(72) Inventors: Vladimir M. Shalaev, West Lafayette, IN (US); Alexandra Boltasseva, West Lafayette, IN (US); Alexei Lagutchev, West Lafayette, IN (US); Alexander Senichev, West Lafayette, IN (US); Zachariah O. Martin, West Lafayette, IN (US); Demid Sychev, West Lafayette, IN (US); Samuel Peana, West Lafayette, IN (US); Xiaohui Xu, Lafayette, IN (US); Omer Yesilyurt, West Lafayette, IN (US); Vahagn Mkhitaryan, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 409 days.

(21) Appl. No.: 17/713,850

(22) Filed: Apr. 5, 2022

(65) Prior Publication Data
US 2022/0317335 A1    Oct. 6, 2022

Related U.S. Application Data

(60) Provisional application No. 63/297,508, filed on Jan. 7, 2022, provisional application No. 63/170,569, filed on Apr. 5, 2021.

(51) Int. Cl.
*G02B 1/00*    (2006.01)
*B82Y 20/00*    (2011.01)
(Continued)

(52) U.S. Cl.
CPC ............... *G02B 1/002* (2013.01); *G02B 5/22* (2013.01); *B82Y 20/00* (2013.01); *B82Y 40/00* (2013.01); *G02B 2207/101* (2013.01)

(58) Field of Classification Search
CPC .... G02B 1/002; G02B 5/22; G02B 2207/101; B82Y 20/00; B82Y 40/00; H10N 99/00
See application file for complete search history.

(56) References Cited

U.S. PATENT DOCUMENTS

2005/0255619 A1* 11/2005 Negro ........................ H01S 3/16
257/E33.068

FOREIGN PATENT DOCUMENTS

CN          107359226 A  * 11/2017 ............. H01L 33/04

OTHER PUBLICATIONS

Vogl et al., "Fabrication and Deterministic Transfer of High-Quality Quantum Emitters in Hexagonal Boron Nitride", ACS Photonics 2018, 5, 2305-2312. (Year: 2018).*

(Continued)

*Primary Examiner* — Omar R Rojas
(74) *Attorney, Agent, or Firm* — Purdue Research Foundation (57) ABSTRACT

A photon emitter includes a multi-layer film. The multi-layer film includes a first material layer and a second material layer, and the multi-layer film includes an interface surface between the first and second material layers. The first material layer includes silicon nitride. The multi-layer film is formed by positioning the silicon nitride over the second material layer and energetically activating the combination of the first material layer and the second material layer. The interface surface is operable to emit single photons.

12 Claims, 8 Drawing Sheets

(51) Int. Cl.
    *B82Y 40/00* (2011.01)
    *G02B 5/22* (2006.01)

(56) References Cited

OTHER PUBLICATIONS

Munoz, P. et al., Foundry developments towards silicon nitride photonics from visible to the mid-infrared, IEEE Journal of Selected Topics in Quantum Electronics 25.5 (2019).
Kim, J. et al., Hybrid integration methods for on-chip quantum photonics, Optica 7.4 (2020).
Lu, X. et al., Chip-integrated visible-telecom entangled photon pair source for quantum communication. Nat. Phys. 15, 373-381 (2019).
Gaeta, A. L. et al., Photonic-chip-based frequency combs. Nat. Photonics. 13, 158-169 (2019).
Awschalom, D. et al., Development of Quantum Interconnects (QuICs) for Next-Generation Information Technologies. PRX Quantum. 2, 017002 (2021).
Li, Q. et al., Efficient and low-noise single-photon-level frequency conversion interfaces using silicon nanophotonics. Nat. Photonics. 10, 406-414 (2016).
Okawachi, Y. et al., Demonstration of chip-based coupled degenerate optical parametric oscillators for realizing a hanophotonic spin-glass. Nat. Commun. 11, 4119 (2020).
Subramanian, A. Z. et al., Low-Loss Singlemode PECVD Silicon Nitride Photonic Wire Waveguides for 532-900 nm Wavelength Window Fabricated Within a CMOS Pilot Line. IEEE Photonics J. 5, 2202809-2202809 (2013).
Huang, Y. et al., CMOS compatible monolithic multi-layer Si_3N_4-on-SOI platform for low-loss high performance silicon photonics dense integration. Opt. Express. 22, 21859 (2014).
Kie, W. et al., Low-loss silicon nitride waveguide hybridly integrated with colloidal quantum dots. Opt. Express. 23, 12152 (2015).
Mouradian, S. L. et al., Scalable Integration of Long-Lived Quantum Memories into a Photonic Circuit. Phys. Rev. X. 5, 031009 (2015).
Peyskens, F. et al., Integration of single photon emitters in 2D layered materials with a silicon nitride photonic chip. Nat. Commun. 10, 1-7 (2019).
Gorin, A. et al., Fabrication of silicon nitride waveguides for visible-light using PECVD: a study of the effect of plasma frequency on optical properties. Opt. Express. 16, 13509 (2008).
Smith, J. et al., Single photon emission and single spin coherence of a nitrogen vacancy center encapsulated in silicon nitride. Appl. Phys. Lett. 116, 134001 (2020).
Lee, J. W. et al., Low Temperature Silicon Nitride and Silicon Dioxide Film Processing by Inductively Coupled Plasma Chemical Vapor Deposition. J. Electrochem. Soc. 147, 1481 (2000).
Tran, T. T. et al., Robust Multicolor Single Photon Emission from Point Defects in Hexagonal Boron Nitride. ACS Nano. 10, 7331-7338 (2016).
Berhane, A. M. et al., Photophysics of GaN single-photon emitters in the visible spectral range. Phys. Rev. B. 97, 165202 (2018).
Jiang, L. et al., The effects of annealing temperature on photoluminescence of silicon nanoparticles embedded in SiNx matrix. J. Non. Cryst. Solids. 357, 2187-2191 (2011).
Goncharova, L. V. et al., Si quantum dots in silicon nitride: Quantum confinement and defects. J. Appl. Phys. 118 (2015), doi:10.1063/1.4936369.
Hiller, D. et al., Absence of quantum confinement effects in the photoluminescence of Si 3N4-embedded Si hanocrystals. J. Appl. Phys. 115 (2014), doi: 10.1063/1.4878699.
Sain, B. et al., Tunable photoluminescence from nc-Si/a-SiNx:H quantum dot thin films prepared by ICP-CVD. Phys. Chem. Chem. Phys. 15, 3881-3888 (2013).
Martin, J. et al., Electron-phonon coupling and localization of excitons in single silicon nanocrystals. Nano Lett. 8, 656-660 (2008).
Schmidt, T. et al., Radiative exciton recombination and defect luminescence observed in single silicon nanocrystals. Phys. Rev. B—Condens. Matter Mater. Phys. 86, 1-11 (2012).
Chizhik, A. M. et al., Imaging and spectroscopy of defect luminescence and electron-phonon coupling in single SiO2 nanoparticles. Nano Lett. 9, 3239-3244 (2009).
Rabouw, F. T. et al., Non-blinking single-photon emitters in silica. Sci. Rep. 6, 1-7 (2016).
Neumann, A. et al., Accidental Contamination of Substrates and Polymer Films by Organic Quantum Emitters. Nano Lett. 19, 3207-3213 (2019).
Lo, H-K. et al., Secure quantum key distribution. Nat. Photonics. 8, 595-604 (2014).
Chu, X. L. et al., A single molecule as a high-fidelity photon gun for producing intensity-squeezed light. Nat. Photonics. 11, 58-62 (2017).
Siampour, H. et al., On-chip excitation of single germanium vacancies in nanodiamonds embedded in plasmonic waveguides. Light Sci. Appl. 7 (2018), doi:10.1038/s41377-018-0062-5.
Awschalom, D. D. et al., Quantum technologies with optically interfaced solid-state spins. Nat. Photonics. 12 (2018), pp. 516-527.
Bogdanov, S. I. et al., Ultrabright Room-Temperature Sub-Nanosecond Emission from Single Nitrogen-Vacancy Centers Coupled to Nanopatch Antennas. Nano Lett. 18, 4837-4844 (2018).
Chiang, C. C. et al., Chip-Compatible Quantum Plasmonic Launcher. Adv. Opt. Mater. 2000889, 1-8 (2020).

\* cited by examiner

SYSTEMS AND METHODS FOR SINGLE-PHOTON EMISSION

CROSS-REFERENCE TO RELATED APPLICATIONS

This application is related to and claims the priority benefit of U.S. Provisional Patent Application No. 63/170,569, entitled "Room Temperature Single-Photon Emitters in Silicon Nitride," filed Apr. 5, 2021, and claims the priority benefit of U.S. Provisional Patent Application No. 63/297,508, entitled "Deterministic Creation of Single Photon Emitting Interface Emitters," filed Jan. 7, 2022, the contents of which are hereby incorporated by reference in their entirety into the present disclosure.

GOVERNMENT SUPPORT CLAUSE

This invention was made with government support under DE-AC05-000R22725 awarded by the Department of Energy and under ECCS2015025 awarded by the National Science Foundation. The government has certain rights in the invention.

TECHNICAL FIELD

The present application relates to optical technology, and more specifically to quantum optical materials operable for emitting single photons at room temperature.

BACKGROUND

This section introduces aspects that may help facilitate a better understanding of the disclosure. Accordingly, these statements are to be read in this light and are not to be understood as admissions about what is or is not prior art.

As quantum optical technology matures and becomes a viable platform for quantum information technology applications, there is a developing need for quantum optical platforms that are not only high performance but also scalable. Many solutions suffer from various issues such as difficulty of fabrication and efficient light coupling. Single-photon emitters (SPEs) enable several emerging applications in quantum information technology, quantum sensing, and quantum communication. Scalable photonic platforms capable of hosting intrinsic or directly embedded sources of single-photon emission are of particular interest for the realization of integrated quantum photonic circuits.

On-chip integrated SPE sources are important elements in various quantum information systems including emerging quantum communication, sensing, and computing. Promising for practical applications, room-temperature SPEs have been observed in diamond, two-dimensional (2D) hexagonal boron nitride (hBN), and semiconducting carbon nanotubes (CNTs), to name a few. On-chip quantum emitters typically rely on hybrid and heterogenous integration, which require complex geometries and approaches to combine materials that host SPEs with photonic circuitry (e.g., waveguides, couplers, photonic crystal cavities, etc.). However, hybrid photonic integration can face challenges related to scalability, optical losses, and efficient coupling between different photonic elements on one chip.

SUMMARY

SPEs enable several emerging applications in quantum information technology, quantum sensing, and quantum communication. Scalable photonic platforms capable of hosting intrinsic or directly embedded sources of single-photon emission are of particular interest for the realization of integrated quantum photonic circuits.

As described herein, SiN has emerged as a promising material for integrated quantum photonics, and aspects of the SPEs described herein are suitable for scalable fabrication of quantum on-chip devices. More particularly, aspects of the SPEs described provide important innovations by demonstrating systems and methods whereby interface emitters, such as SiN—SiO$_2$ emitters, may be fabricated with higher yield and improved location accuracy compared to prior art SPEs, therefore allowing for scalable fabrication. The present disclosure provides systems and methods for fabricating a room-temperature single photon interface emitter. One embodiment of such an interface emitter can include a SiN film grown on a silicon dioxide substrate. These single photo interface emitters provide various advantages, such as being integrated with industry standard silicon nitride Si$_3$N$_4$ based photonic integrated circuits (PICS).

In accordance with aspects of the present disclosure, a photon emitter can include a multi-layer film. The multi-layer film can include a first material layer and a second material layer, and the multi-layer film can also include an interface surface between the first and second material layers. In some embodiments, the first material layer can include silicon nitride. Further, the multi-layer film can be formed by positioning the silicon nitride over the second material layer and energetically activating the combination of the first material layer and the second material layer. The interface surface can be selectively operable to emit single photons.

In accordance with additional aspects of the present disclosure, positioning the silicon nitride over the second material layer can include growing the silicon nitride on the second material layer. In some aspects the second material layer includes silicon dioxide, alumina, or lithium niobate. In other aspects, energetically activating the combination of the first material layer and the second material layer includes activation via annealing.

In accordance with additional aspects of the present disclosure, a method of fabricating a single photon emitting material can include interfacing a first material with a second material on a surface of a film stack and energetically activating the interface by annealing the interface of the first material and the second material. In some aspects, the first material can include silicon nitride and the second material can include silicon dioxide. In additional aspects, the method can include nanofabricating the first and second materials to form a nanostructure on the film stack, where the nanostructure can be formed by portions of the first and second materials. Accordingly, the nanostructure can be configured to protrude in a direction away from the film stack.

This summary is provided to introduce a selection of the concepts that are described in further detail in the detailed description and drawings contained herein. This summary is not intended to identify any primary or essential features of the claimed subject matter. Some or all of the described features may be present in the corresponding independent or dependent claims, but should not be construed to be a limitation unless expressly recited in a particular claim. Each embodiment described herein does not necessarily address every object described herein, and each embodiment does not necessarily include each feature described. Other forms, embodiments, objects, advantages, benefits, features, and aspects of the present disclosure will become apparent to one of skill in the art from the detailed description and drawings contained herein. Moreover, the various apparatuses and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

BRIEF DESCRIPTION OF THE DRAWINGS

While the specification concludes with claims which particularly point out and distinctly claim this technology, it is believed this technology will be better understood from the following description of certain examples taken in conjunction with the accompanying drawings, in which like reference numerals identify the same elements and in which:

The drawings are not intended to be limiting in any way, and it is contemplated that various embodiments of the technology may be carried out in a variety of other ways, including those not necessarily depicted in the drawings. The accompanying drawings incorporated in and forming a part of the specification illustrate several aspects of the present technology, and together with the description serve to explain the principles of the technology; it being understood, however, that this technology is not limited to the precise arrangements shown, or the precise experimental arrangements used to arrive at the various graphical results shown in the drawings.

DETAILED DESCRIPTION

The following description of certain examples of the technology should not be used to limit its scope. Other examples, features, aspects, embodiments, and advantages of the technology will become apparent to those skilled in the art from the following description, which is by way of illustration, one of the best modes contemplated for carrying out the technology. As will be realized, the technology described herein is capable of other different and obvious aspects, all without departing from the technology. Accordingly, the drawings and descriptions should be regarded as illustrative in nature and not restrictive.

It is further understood that any one or more of the teachings, expressions, embodiments, examples, etc. described herein may be combined with any one or more of the other teachings, expressions, embodiments, examples, etc. that are described herein. The following-described teachings, expressions, embodiments, examples, etc. should therefore not be viewed in isolation relative to each other. Various suitable ways in which the teachings herein may be combined will be readily apparent to those of ordinary skill in the art in view of the teachings herein. Such modifications and variations are intended to be included within the scope of the claims.

I. Overview

As described in the various embodiments herein, high-purity, room-temperature SPEs may be generated and observed in SiN grown on silicon dioxide coated silicon wafers. This platform represents a suitable material combination for enabling integrated photonics that is mature in terms of fabrication, quality control, and integration. The utilization of quantum emitters directly embedded in SiN mitigates losses resulting from low coupling efficiency of emission into cavities and photonic waveguides in hybrid systems. The described SPEs may be fabricated through the careful selection of growth conditions for low auto-fluorescing SiN. However, in certain embodiments, it should be understood that the described SPEs may also be fabricated through the careful selection of growth conditions for non-low auto-fluorescing SiN as well.

Even though alternative demonstrations of hybrid integration have been reported, including large-scale integration of diamond-based quantum emitters and an aluminum nitride photonic platform, there has been an important desire for developing architectures and approaches that utilize well-established optical circuitry platforms with intrinsic or controllably embedded SPEs. So far, intrinsic sources of single-photon emission have been demonstrated in wide-bandgap semiconductor materials such as silicon carbide (SiC), gallium nitride (GaN), and aluminum nitride (AlN), each of which may be utilized for the realization of quantum photonic circuitry elements.

A. Room Temperature Single-Photon Emitters in Silicon Nitride

Room-temperature SPEs in SiN films grown on silicon dioxide coated silicon substrates, particularly SPEs formed at the interface of non-stoichiometric low-autofluorescing SiN films and silicon dioxide and other suitable materials, are described. Stoichiometric silicon nitride $Si_3N_4$ has emerged as one viable platform for visible photonic circuitry, and more particularly for integration with single photon emitting solid state color centers. The SiN native emitter may in certain applications circumvent many of the difficulties faced by alternative solutions. For example, SiN single-photon emitters (SPEs) may offer homogeneous integration with SiN (and $Si_3N_4$) photonic circuitry.

Among several state-of-the-art quantum photonic platforms, $Si_3N_4$ has emerged as an attractive material for the realization of integrated photonic components compatible with the metal-oxide-semiconductor (CMOS) process. Silicon nitride offers a relatively high refractive index (n~2.0) and provides the required index contrast with silicon dioxide ($SiO_2$, n=1.5) for the realization of efficient photonic waveguides and other on-chip components. For example, on-chip frequency converters and optical parametric oscillators were realized with SiN-based microring resonators. Silicon nitride also offers a large transparency window spanning from near-infrared (NIR) wavelengths down to at least 500 nm. Low-loss silicon nitride waveguides with operation wavelengths in the range of approximately 532 nm to 1580 nm have been demonstrated. The transparency window of silicon nitride further enables integration with light sources which emit in the visible wavelength range such as colloidal quantum dots, nitrogen vacancies in diamond, and two-dimensional (2D) transition metal dichalcogenides (TMDCs). However, commonly used stoichiometric $Si_3N_4$ has relatively strong background photoemission in the visible range that hinders quantum measurements, especially addressing SPEs operating in this spectral region. To make silicon nitride practical for quantum photonic applications in the visible range, non-stoichiometric nitrogen-rich SiN films may be used. Nitrogen-rich SiN films grown by plasma-enhanced chemical vapor deposition (PECVD) can substantially lower auto-fluorescence compared to stoichiometric $Si_3N_4$ and still have a moderate refractive index of approximately 1.9, which is suitable for quantum photonic measurements of encapsulated nitrogen vacancy centers.

Accordingly, SiN-based platforms are suitable for scalable fabrication of quantum on-chip devices. Photophysical analysis reveals bright (e.g., approximately up to million counts per second ($10^6$ counts/s)), stable, linearly polarized, and pure quantum emitters in SiN films with the value of the second-order autocorrelation function at zero time delay $g(2)(0)$ below approximately 0.2 at room temperatures. The emission is suggested to originate from a specific defect center in silicon nitride due to the narrow wavelength distribution of the observed luminescence peak. SPEs in silicon nitride enable direct, scalable and low-loss integration of quantum light sources with this well-established photonic on-chip platform.

In one embodiment, the SiN films may be grown by a special type of PECVD called High Density Plasma Chemical Vapor Deposition (HDPCVD). HDPCVD uses an inductively coupled plasma source to generate a higher plasma density compared to PECVD which enables deposition at lower temperatures (e.g., from 80 to 150° C.), improved quality of low-temperature films, and enhanced trench-fill capability. To reduce the auto-fluorescence of SiN in the visible spectral range, non-stoichiometric SiN films may be grown by increasing the ratio of $N_2$ to $SiH_4$ fluxes. The dependence of the SiN background fluorescence on the growth conditions is provided in greater detail below. The SiN films may be grown on at least two types of substrates, namely, commercially available bare silicon substrates and silicon substrates topped by a 3-μm-thick silicon dioxide ($SiO_2$) layer suitable for waveguides fabrication. Optical characterization of bare $SiO_2$-on-Si wafers may be performed prior to SiN deposition to evaluate the background fluorescence. The background signal can show negligibly low counts without any localized emission centers. The target thickness of SiN films was selected, in the described embodiment, to be about 200 nanometers. For activation of quantum emitters, thermal annealing may be applied for such materials as hBN. A rapid thermal annealing (RTA) of the samples may be applied after the deposition. For this purpose, the samples can be heated to approximately 1100° C. for 120 seconds in a nitrogen atmosphere using the bench-top Jipelec Jetfirst RTA system. Thermal annealing at 850° C. may also be optionally applied for, for example, 60 minutes under argon atmosphere in a standard furnace (e.g., a Lindberg/BLUE M MOLDATHERM manufactured by Thermo Fisher Scientific Inc.). Further, the alignment markers may be fabricated by focused ion beam milling to identify emitters positions for consecutive measurements.

Figure 1A:
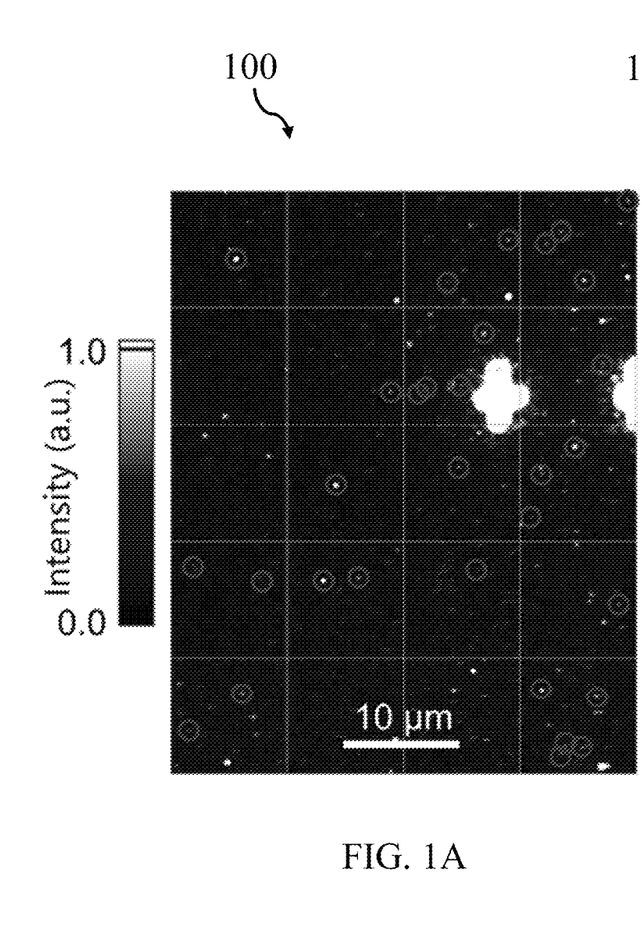
FIG. 1A depicts a 40 μm×50 μm confocal photoluminescence intensity map of an SiN layer grown on 3-μm-thick SiO2.
Figure 1B:
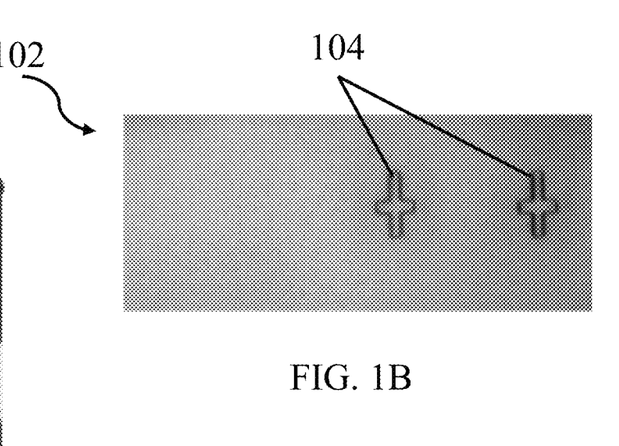
FIG. 1B depicts an optical image of the sample of FIG. 1A, showing markers prepared by the focused ion beam milling to identify the same area for consecutive measurements.
Figure 1C:
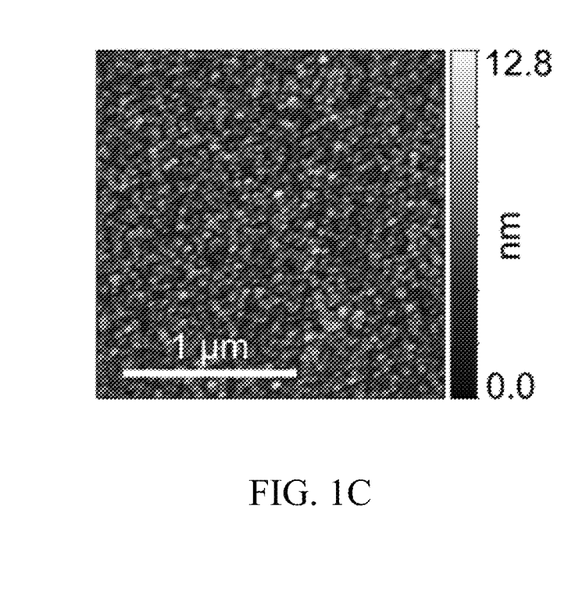
FIG. 1C depicts a representative 2 μm×2 μm atomic force microscopy (AFM) image of the sample revealing the surface morphology of the SiN film of FIG. 1A.

Shown in FIG. 1A is a confocal scanning photoluminescence intensity map (100) for one example experimental setup of a SiN layer grown on 3-μm-thick $SiO_2$ on a silicon wafer. As shown, a plurality of point-like emitters (each circled) are revealed and randomly distributed across the sample. As shown in FIG. 1B, bright, cross-like features are alignment markers. The optical image (102) of the sample surface with alignment markers (104) is shown in FIG. 1B. The estimated density of quantum emitters was at least 1-2 emitters per 10×10 μm² area, which is comparable with previously reported quantum emitters in GaN and AlN. FIG. 1C shows the surface morphology of the SiN film measured by atomic force microscopy (AFM). As shown, the surface of the SiN sample has a root mean square (rms) roughness of about 1.5 nm with the appearance of grainy surface structure.

Figure 2A:
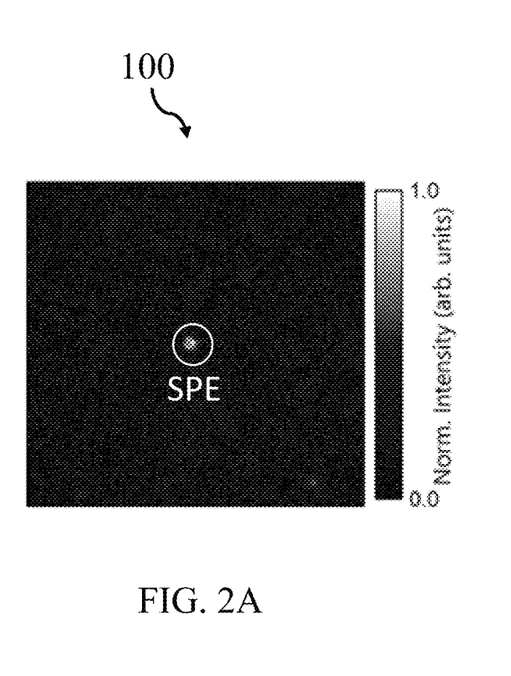
FIG. 2A depicts a 10 μm×10 μm confocal photoluminescence map of a single-photon emitter.
Figure 2B:
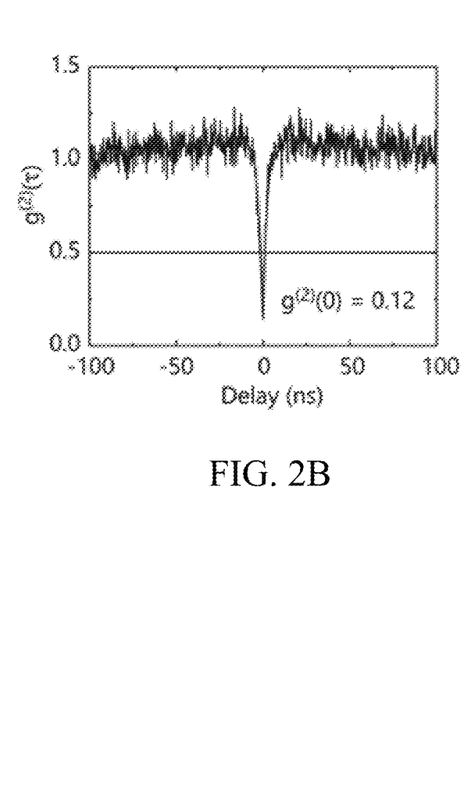
FIG. 2B depicts an antibunching curve obtained from a second-order autocorrelation measurement $g(2)(\tau)$ of the emission of the single-photon emitter of FIG. 2A.
Figure 2C:
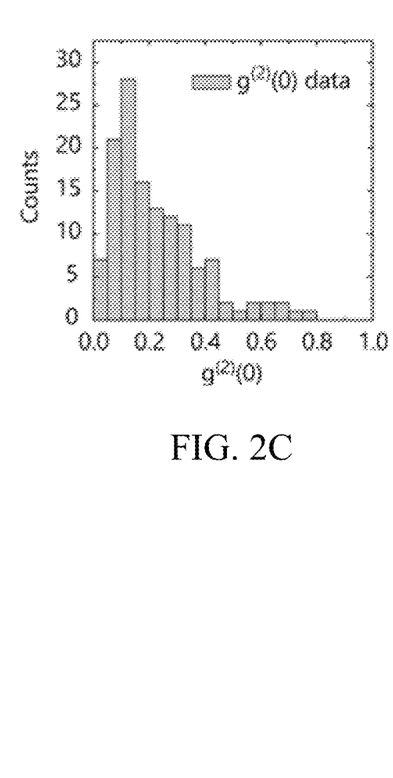
FIG. 2C depicts a histogram of the $g(2)(\tau)$ values distribution at zero delay time ($\tau=0$) from 130 emitters with a bin size of 0.05.

FIGS. 2A-2C show an example of the photophysical analysis of one representative SPE. Shown in FIG. 2A is the position of the emitter from the photoluminescence intensity map. First, the non-classical photon statistics from the selected emitter was confirmed by second-order autocorrelation $g(2)(\tau)$ measurements. FIG. 2B shows the $g(2)(\tau)$ histogram recorded under continuous laser excitation. The data was fit with a three-level model as the $g(2)(\tau)$ histogram exhibits slight bunching at longer time scales with increasing of excitation power. The $g(2)(\tau)$ value was obtained at zero delay time (T=0) of 0.12 indicating a high-purity single-photon source. To assess an average photon purity across many SPEs in SiN, the $g(2)(\tau)$ data was collected from the total of 130 emitters, as shown in FIG. 2C. The majority of the emitters of FIG. 2C show the $g(2)(0)$ well below the threshold value 0.5, confirming that the emission is non-classical and the sources are SPEs. Moreover, the studied SPEs show on average high quantum emission purity with the $g(2)(0)$ value of about 0.2. The $g(2)(0)$ values shown in FIGS. 2B and 2C were obtained without any background correction or spectral filtering suggesting that the real quantum emission purity could have been higher than the measured one. The fluorescence lifetime was also measured for eight different emitters with pulsed laser excitation. The emission lifetime was found to range from 1.4 to 3.9 ns, with the average value across measured emitters of 2.4 ns.

Figure 3A:
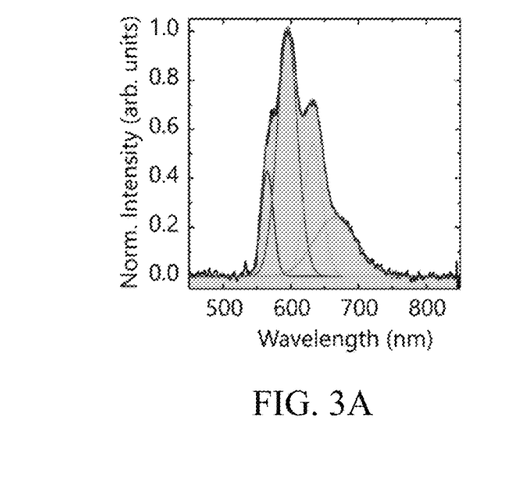
FIG. 3A depicts a representative room-temperature photoluminescence spectrum of a SiN single-photon emitter, which can be fitted with four Gaussian peaks.

Next, the spectral characteristics of the selected SPE were addressed. Particularly, the corresponding photoluminescence spectrum is shown in FIG. 3A. The photoluminescence data was background-corrected and normalized to the maximum intensity. The photoluminescence spectrum consists of several peaks which can be well fitted with four Gaussian lines. Particularly, the most intense photoluminescence band is accompanied with satellite peaks of lower intensity on both sides. The presented photoluminescence spectrum of the SPE in SiN appears to be different from typical photoluminescence spectra of SPEs in crystalline hBN, GaN, and AlN that exhibit a prominent zero-phonon line (ZPL) and lower intensity red-shifted phonon sidebands (PSBs). This can point to the different origin of the emitters and/or effects in the amorphous SiN matrix. To gain a better understanding of the structure of the PL spectra and PL peaks distribution, PL data may be from several SPEs, as discussed below.

Figure 3B:
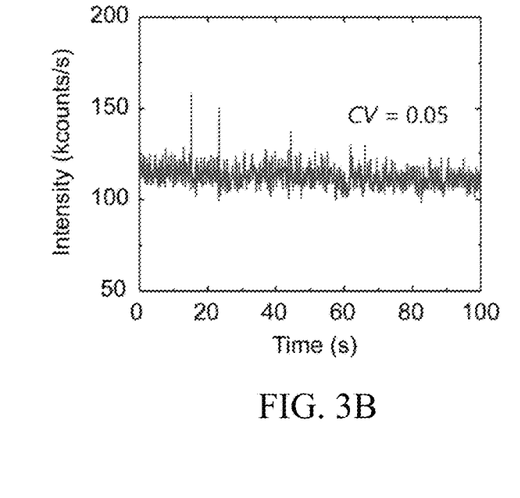
FIG. 3B depicts a graph of photoluminescence stability measurement of the same SiN single-photon emitter of FIG. 3A, showing photoluminescence intensity variation over time with no obvious blinking or bleaching and a low coefficient of variation.
Figure 3C:
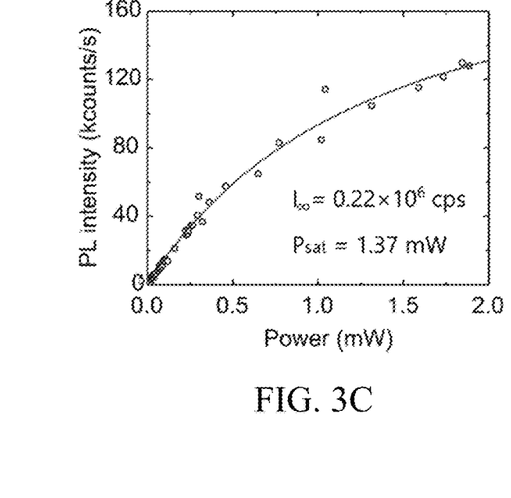
FIG. 3C depicts a graph showing a photoluminescence intensity dependence on the pump laser power of the same SiN single-photon emitter of FIG. 3A, providing the maximum photoluminescence intensity at the saturation power.

For the SPE shown in FIG. 2A, essential metrics of quantum emitters are assessed such as stability, brightness and emission rate. The selected emitter exhibits stable emission without obvious blinking or bleaching over a measurement period of 100 seconds under near-saturation excitation power of 1.4 mW, as shown in FIG. 3B. The photoluminescence stability is quantified with a coefficient of variation $CV=\sigma/\mu$, where $\sigma$ is a standard deviation and $\mu$ is a mean value of photoluminescence intensity during the course of the measurements. For this particular emitter, the variation of photoluminescence intensity of 0.05 was obtained. Such behavior may be observed for most of the emitters. However, some SPEs show blinking and switching between "on" and "off" states were also identified. The saturation behavior of the emission as a function of excitation power I(P) is shown in FIG. 3C. The data were fitted with the equation:

$$I(P)=I_\infty \times P/(P+P_S),$$

where $I_\infty$ and $P_S$ are fitting parameters that correspond to the maximum count and saturation power, respectively. The brightness of the emitter of $I_\infty=0.22\times10^6$ counts per second was obtained at a saturation power of $P_S=1.37$ mW, as measured before the objective. The background fluorescence intensity at the same excitation power was on the order of $0.2\times10^5$ counts per second. Additionally, single-photon emitters with photoluminescence intensity up to million counts per second were also observed. Accordingly, the observed emitter brightness was comparable to the room-temperature emission from SPEs in III-Nitride semiconductors.

Figure 3D:
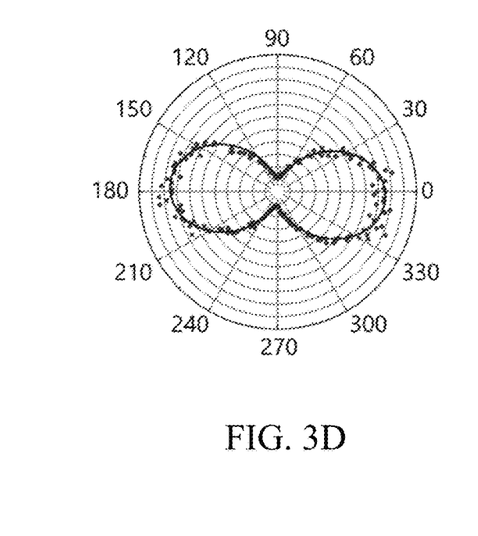
FIG. 3D depicts a graph showing a representative polarization diagram of the photoluminescence emission $I(\theta)$ as measured from another emitter.

In addition, the polarization dependence of emission was measured from SPEs in SiN. The polarization diagram of the PL emission $I(\theta)$ of an emitter is shown in FIG. 3D as an example. The data is fitted with a $\cos^2(\theta)$-form fit function yielding the polarization visibility $(I_{max}-I_{min})/(I_{max}+I_{min})$ of approximately 78%. The results indicate that the emission originates from linearly polarized dipole transitions.

Figure 4A:
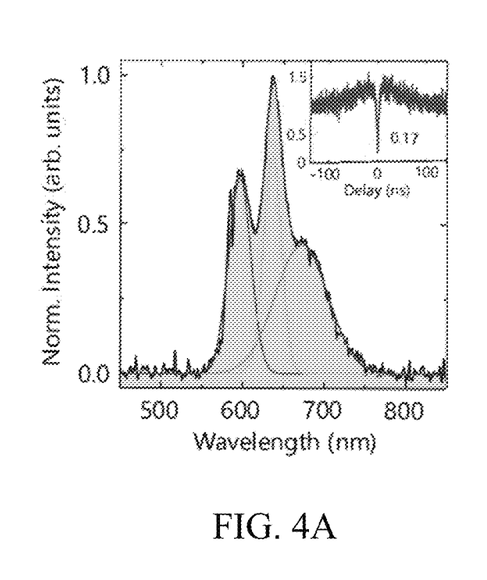
FIG. 4A depicts a representative photoluminescence spectrum of a single-photon emitter, which can be fitted with three Gaussian peaks, inset is the antibunching curve from second-order autocorrelation measurements of the emission from the corresponding emitter.
Figure 4B:
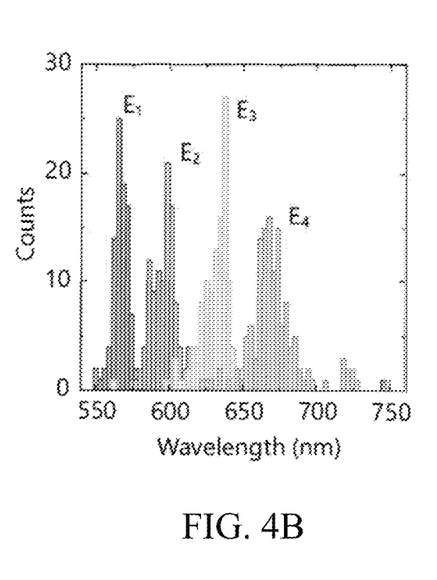
FIG. 4B a histogram of the wavelength distribution of one hundred thirty-three SiN single-photon emitters, having a bin width of 3 nm.
Figure 4C:
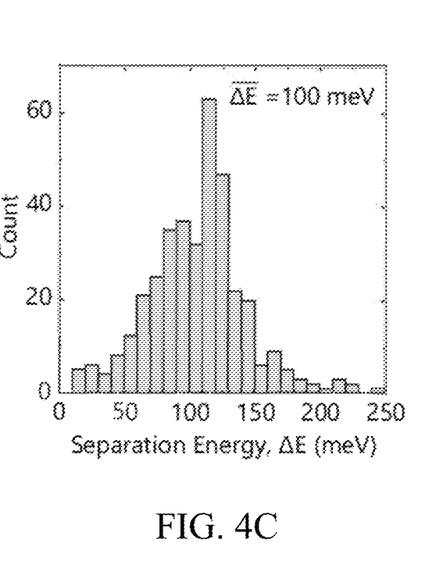
FIG. 4C depicts a histogram of the distribution of the separation energy $\Delta E$ obtained for all peaks of FIG. 4B resolved in photoluminescence spectra, having a bin width of 10 meV.

The SPE's photoluminescence spectra was also analyzed. As shown in FIG. 4A, the emission spectrum for another SPE exhibits slightly different spectral characteristics having only three PL peaks compared to the one in FIG. 3A. In total, the emission spectra of 133 individual SPEs were analyzed with the best signal-to-noise ratio recorded from different scans and three independently fabricated samples. The data was fitted with the Gaussian line shapes to assess the spectral characteristics of the PL peaks. Ultimately, most of the emitters exhibit emission spectra composed of PL peaks of the nearly the same wavelength. FIG. 4B shows a histogram of the wavelength distribution for these emitters. The PL peaks are clustered around E_1=567 nm, E_2=596 nm, E_3=632 nm, and E_4=670 nm with standard deviation values of 6 nm, 7 nm, 9 nm, and 10 nm, respectively. The most intense PL peak in these spectra is typically at one of the two central wavelengths. The observed fluctuation of the PL peak wavelength could be attributed to variations in the surrounding SiN matrix. It was discovered that there are also emitters showing long wavelength PL peaks above 700 nm. These emitters are much less frequent than those showing PL peaks around the wavelength indicated in FIG. 4B.

As mentioned above, the SiN films of the experimental embodiments were grown on two types of substrates: bare silicon substrates with native oxide layer and silicon substrates topped by a 3-μm-thick $SiO_2$ layer. The latter were studied in detail via the experiments described. In addition, the SPEs were identified in SiN samples grown directly on Si substrates without an intentional $SiO_2$ layer, and the density of the emitters in the studied SiN/Si samples was found to be far lower than presented above.

Considering SPEs in SiN in the broader context of other room-temperature single-photon emitters, the photophysical characteristics of SiN-based quantum emitters are on par with those found in GaN, AlN, and silica. The room-temperature operation makes them viable candidates for rapid characterization and practical applications. The SiN SPEs exhibit high single-photon purity observed without spectral filtering and background correction. The average single-photon purity from 130 newly discovered SiN SPEs appears to be at the $g(2)(0)$ value of about 0.2 with the lowest observed value of 0.03. The emission with the rate exceeding $10^5$ counts per second observed from SiN quantum emitters is also typical for SPEs in materials with a high refractive index (i.e. greater than or equal to 2.0), such as III-Nitrides. The high refractive index of bulk materials typically means poor collection efficiencies. However, the light extraction efficiency from such SPEs can be improved by using patterned substrates that provide the increased reflection area. Importantly, the quantum emitters revealed in SiN as described herein are viable candidates for monolithic integration with SiN/SiO$_2$-based photonic integrated circuits where emission can be guided to the on-chip single-photon detectors.

Accordingly, bright, stable, linearly polarized and high-purity sources of single photon emission at room temperature in SiN samples may be observed as described herein. These SPEs may be produced by the HDPCVD growth of SiN on Si and SiO$_2$ substrates, and optionally with subsequent rapid thermal annealing.

Figure 5A:
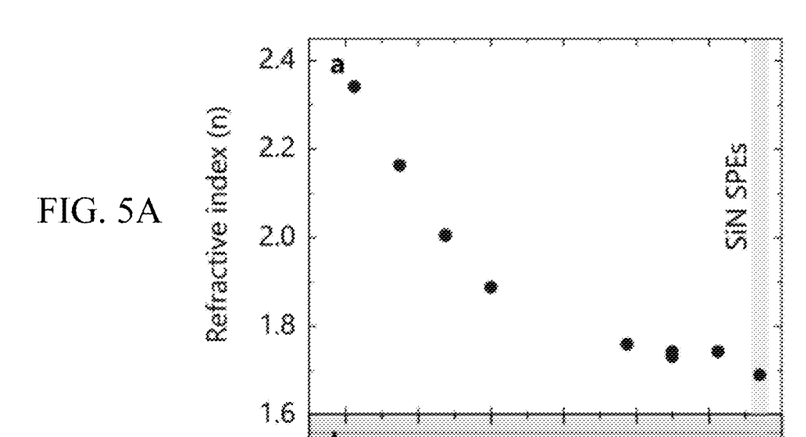
FIG. 5A depicts a graphical representation of SiN refractive index dependence as a function of $N_2$ and $SiH_4$ fluxes ratio at $\lambda=637$ nm extracted from the fit to ellipsometry data.
Figure 5B:
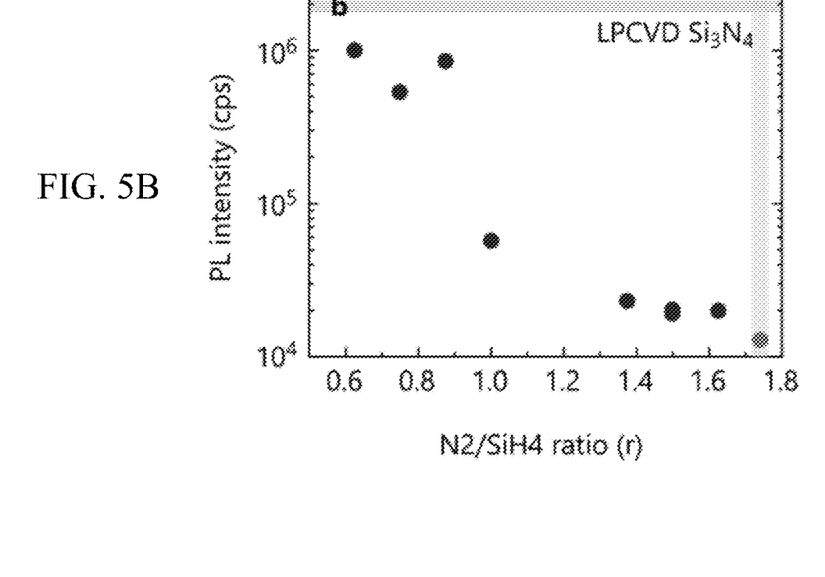
FIG. 5B depicts a graphical representation of background fluorescence intensity dependence as a function of $N_2$ and $SiH_4$ of SiN films of the experiment of FIG. 5A.
Figure 5C:
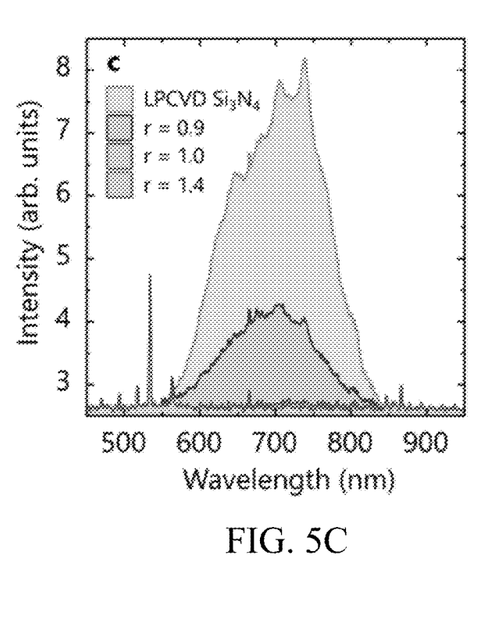
FIG. 5C depicts a graphical representation showing representative photoluminescence spectra showing the decrease of the background fluorescence intensity with the increase of the $N_2/SiH_4$ ratio beyond the detection sensitivity of the spectrometer.

Chemical composition and material properties of SiN grown by HDPCVD can be controlled by varying the ratio of SiH$_4$, N$_2$, and Ar gases and radio-frequency power. The autofluorescence of SiN in the visible range can be substantially reduced by increasing the ratio of N$_2$ and SiH$_4$ fluxes. Nitrogen-rich SiN films exhibit a reduction of the background emission along with the refractive index of the material. As shown by experiment, a series of SiN samples may be grown under different SiH$_4$ fluxes, while keeping other fluxes and radio-frequency plasma constant. For the nitrogen-rich SiN film, the autofluorescence in the visible range was reduced up to approximately $10^2$ compared to the stoichiometric LPCVD-grown Si$_3$N$_4$. The dependence of the background fluorescence and refractive index of SiN as function of N$_2$/SiH$_4$ ratio is given in FIGS. 5A-5B. As shown in FIG. 5A, a refractive index (n) at $\lambda$=637 nm was extracted from the fit to ellipsometry data. The refractive index of stoichiometric Si$_3$N$_4$ grown by LPCVD is approximately 2.0. The refractive index of SiN at N$_2$/SiH$_4$ ratio r=1, at which stoichiometric Si$_3$N$_4$ is expected, is slightly lower n ~1.9. For the high nitrogen contents, SiN shows the decrease of the refractive index to about 1.7. At the laser excitation power of 1.5 mW, the fluorescence intensity of the LPCVD-grown Si$_3$N$_4$ can be measured of about $2.3 \times 10^6$ counts per second, while HDPCVD-grown SiN at the N$_2$/SiH$_4$ ratio of just r=1.0 is $5.7 \times 10^4$ counts per second and can be further reduced with increased flux ratio. Shown in FIG. 5B is the background fluorescence intensity of SiN films. The SiN films exhibit partial background fluorescence bleaching by the pump laser. The measured values are the saturated intensities which stay unchanged with longer laser exposure. FIG. 5C shows the characteristic background fluorescence spectra of SiN films grown by two different techniques, LPCVD and HDPCVD. Specifically, FIG. 5C shows representative photoluminescence spectra showing the decrease of the background fluorescence intensity with the increase of the N$_2$/SiH$_4$ ratio beyond the detection sensitivity of the spectrometer. The photoluminescence spectrum of stoichiometric Si$_3$N$_4$ grown by LPCVD is shown as a reference. As can be seen, the background fluorescence covers a broad spectral region where solid-state SPEs are typically observed. The increase of the N$_2$/SiH$_4$ ratio leads to clear suppression of the background fluorescence beyond the detection sensitivity of our spectrometer. Similar behavior was reported for SiN films grown by PECVD by varying the NH$_3$ to SiH$_4$ gas flow ratio.

B. Deterministic Creation of Single-Photon Emitting Interface Emitters

By growing SiN on SiO$_2$ films using HDPCVD and energetically activating the interface, interface single photon emitters may be observed. One method of energetically activating the interface is by annealing. Further, annealing processes may include, but not be limited to, laser annealing, conventional annealing, rapid annealing, or other known annealing methods. However, such emitters typically occur at random within the film thereby in some cases inhibiting their use commercially. By nanopatterning of the SiN or SiO$_2$ film and either post or pre annealing localized defects may be created. The defects can be configured to occur at the interface of the SiN and SiO$_2$ such that the SPEs are created where both films are present in the nanostructure (e.g., a nanopillar protruding from a base of an SiO$_2$ film). Since the interface area within the nanostructure is small (e.g., having a diameter of less than 200 nanometers), the interface-based SPEs may be deterministically localized. Additionally, by annealing after nanopatterning (post-annealing), enhancements in the probability that a particular nanostructure contains an SPE may be observed.

In some embodiments, CMOS materials (e.g., Si, SiO2, SiN) and CMOS processes (e.g., DUV & EUV compatible lithography, ICP Etching, and RTA) may be utilized as opposed to other deterministic creation processes (e.g., ion implantation, laser defect creation, heterogeneous strain-based approaches, etc.). Further, in addition to being deterministic, the described methods also provide a parallel processing approach more capable of scaling (e.g., from laboratory sized pieces to 200-millimeter wafers, standard in the CMOS semiconductor industry). Such scalability along with the single photon emitting properties of these emitters may enable the next generation of commercially scalable quantum information science and technology from quantum security and encryption to quantum simulation and computing.

To create large scale SPEs, SiN may be grown on SiO$_2$-coated silicon wafers. Particularly, SiN may be grown on SiO2-coated silicon wafers using one of many methods, such as by using sputtering, low pressure chemical vapor deposition (LPCVD), high density plasma chemical vapor deposition (HDPCVD), or plasma-enhanced chemical vapor deposition (PECVD) growth processes. The SiN may be grown to a thickness of for example, approximately 50 nanometers, and the oxide may be, for example, 3 micrometers, grown commercially on Si via industry standard low pressure chemical vapor deposition (LPCVD). An etch hardmask, such as a chrome hardmask or other suitable material, may then be patterned using electron beam lithography and liftoff. Further, this mask may be used during the reactive ion etching (RIE) of the structures. The etch depth can be, for example, approximately 90 nanometers, leading to an intentional over-etch of approximately 40 nanometers into the SiO$_2$. This may be done to avoid or reduce the occurrence of the creation of SPEs between structures. Once the structures are etched, the etch hardmask may be chemically removed and the sampled cleaned with, for example, acid stripping to remove any organic contamination. Rapid thermal annealing (RTA) may then be performed for 60 seconds at, for example, 1100 Celsius to activate the SiN interface emitters.

Figure 6:
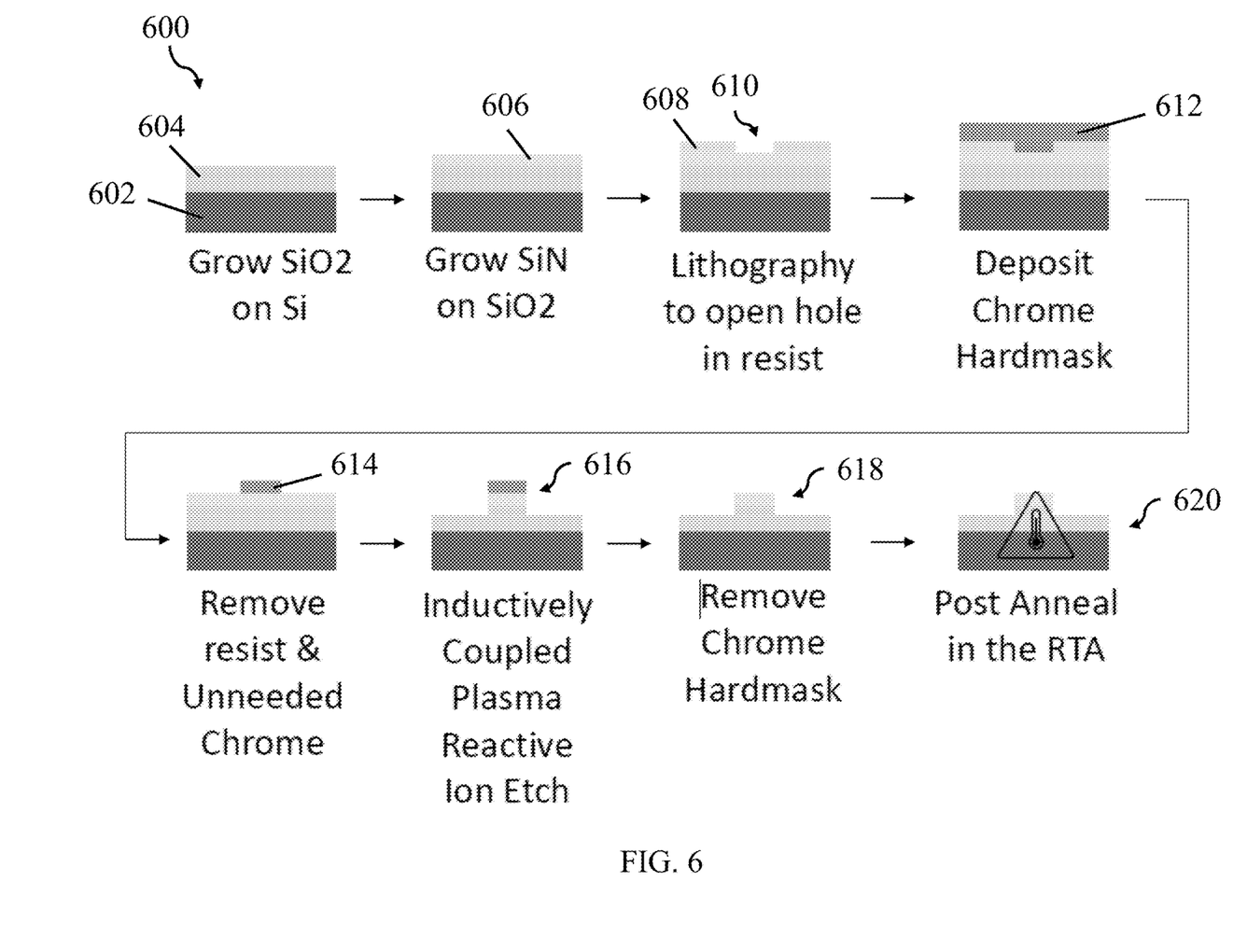
FIG. 6 depicts a graphical flowchart of one method of nano-fabricating $SiN/SiO_2$ nanostructures hosting SPEs, utilizing post-annealing.

One exemplary method (600) to create large scale SPEs is shown in FIG. 6. Particularly, method (600) uses a post-annealing technique. It should be understood that, while one nanopattern is described herein, various other nanopatterns may be deployed using the methods described within this disclosure. The method includes the steps of (a) growing SiO$_2$ (604) on Si (602) using an oxidation, CVD, or physical vapor deposition (PVD) process; (b) growing SiN (606) on the SiO$_2$ (604); (c) using lithography or other similar techniques to open a hole (610) in the resist (608) on the SiN; (d) depositing an etch hardmask (612), thereby filling the hole (610); (e) removing the resist (608) and any unneeded etch hardmask (612) to leave a portion (614) of the etch hardmask (612) in place of the hole (610); (f) coupling, such as inductively, a plasma reactive ion etch to create an initial structure (616); (g) removing the portion (614) of etch hardmask to create a resultant structure (618); and finally (h) post-annealing the film (620) via a rapid thermal anneal (RTA) process. In this method (600), liftoff with an etch hardmask (612) is utilized. However, a more direct mask technique involving the use of the resist (608) directly as a mask would also prove effective. Further, the orders of growth of the SiN (606) or the $SiO_2$ (604) may be reversed from what is shown as the SPEs are configured to occur at the interface between them. Finally, while ICP plasma etching is described, other methods, for example direct SiO liftoff, may be utilized.

Figure 7:
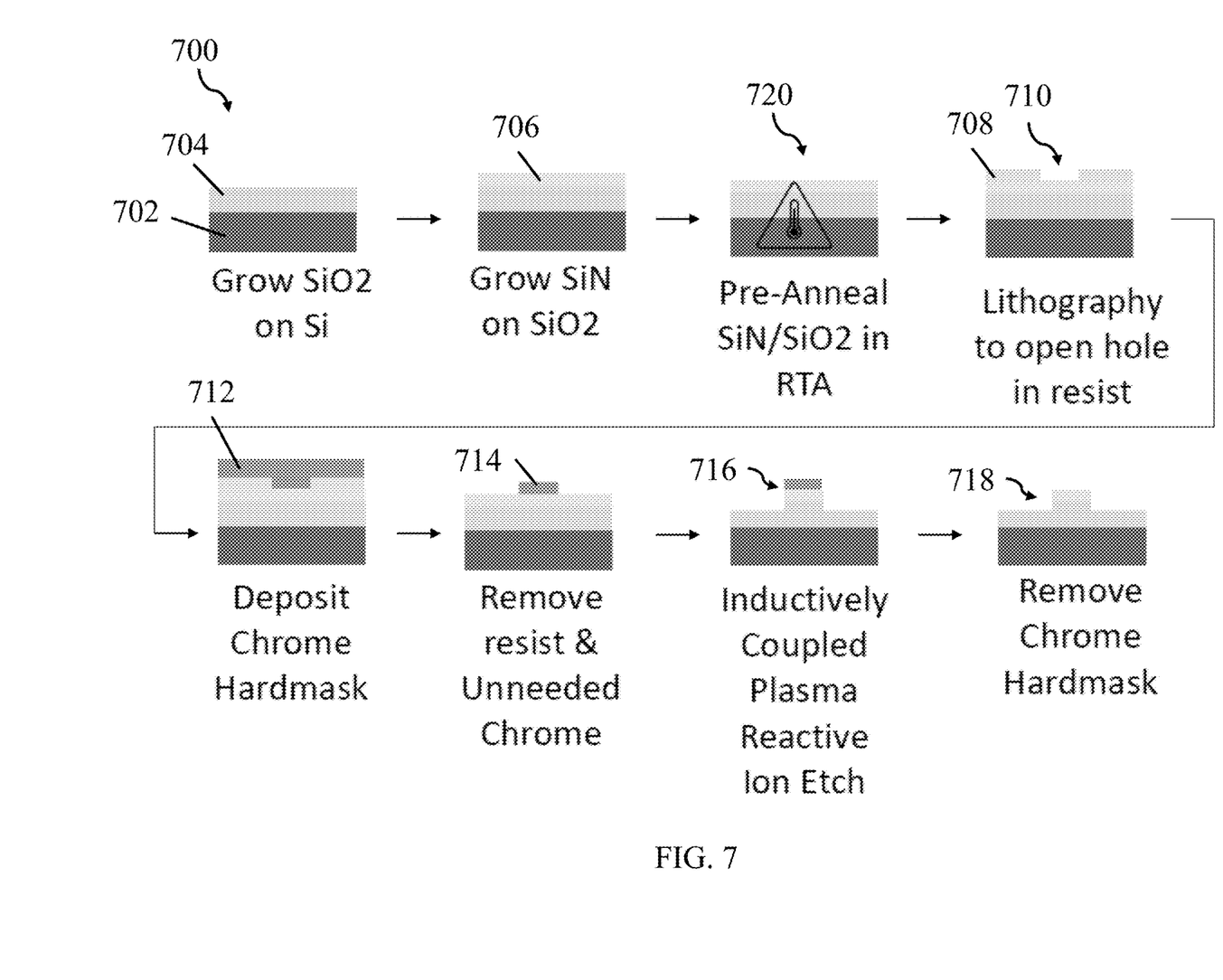
FIG. 7 depicts a graphical flowchart of an alternative method of nano-fabricating $SiN/SiO_2$ nanostructures hosting SPEs, utilizing pre-annealing.

Another exemplary method (700) to create large scale SPEs is shown in FIG. 7. Particularly, method (700) uses a pre-annealing technique. The method includes the steps of (a) growing $SiO_2$ (704) on Si (702); (b) growing SiN (706) on the $SiO_2$ (704); (c) pre-annealing the film (720) via a rapid thermal anneal (RTA) process; (d) using lithography or other similar techniques to open a hole (710) in the resist (708) on the SiN; (d) depositing an etch hardmask (712), thereby filling the hole (710); (e) removing the resist (708) and any unneeded etch hardmask (712) to leave a portion (714) of etch hardmask (712) in place of the hole (710); (f) coupling, such as inductively, a plasma reactive ion etch to create an initial structure (716); (g) removing the portion (714) of etch hardmask to create a resultant structure (718) on the film (720). In this method (700), liftoff with an etch hardmask (712) is utilized. However, a more direct mask technique involving the use of the resist (708) directly as a mask would also prove effective. Further, the orders of growth of the SiN (706) or the $SiO_2$ (704) may be reversed from what is shown as the SPEs are configured to occur at the interface between them. Finally, while ICP plasman etching is described, other methods, for example direct SiO liftoff, may be utilized.

Figure 8A:
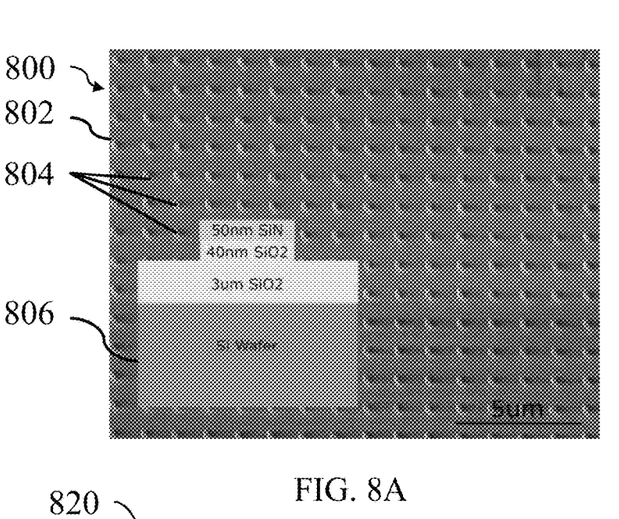
FIG. 8A depicts a scanning electron microscope (SEM) image of a nanostructure array, showing an inset of a cross sectional diagram of the nanostructures shown in the SEM image.

Shown in FIG. 8A is a scanning electron microscope image (800) of one exemplary nanostructure array (802), having a plurality of emitting structures (804), each formed via the methods described herein. The inset (806) shows a cross sectional diagram of one structure (804) after etching and etch mask stripping. The structures (804) may have a diameter of, for example, 170 nanometers and may be spaced, for example, 1 micrometer, apart from each other. However, it should be understood that various alternative sizing and spacing may be fabricated depending on the needs of the particular application.

Figure 8B:
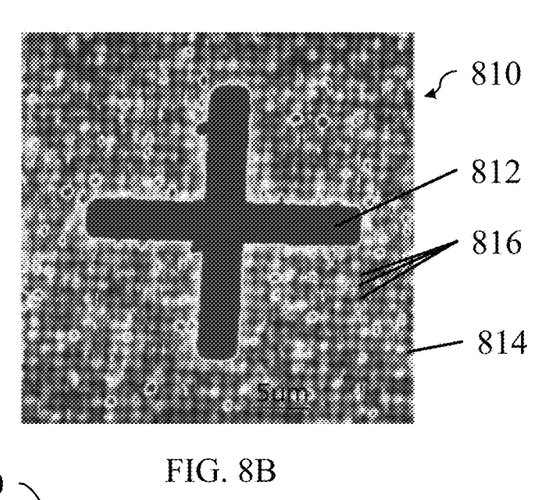
FIG. 8B depicts a 30 um×30 um scanning confocal photoluminescence map taken with an excitation wavelength of 532 nanometers of the first experimental setup, showing a cross as an alignment marker.

After fabrication and thermal processing, photoluminescence (PL) mapping may be performed using a confocal microscope. Shown in FIG. 8B are results (810) of one experiment showing spatial mapping of the array (802). Specially, the cross (812) in the center of the resultant image (810) is an alignment mark to aid in finding the arrays (814), corresponding to the arrays (804) of FIG. 8A. Structures (816) can be seen all around the cross (812). Notably, with regard to the results (810), the nanostructure diameter appears much larger in the PL map results (810) compared to the scanning electron microscope image (800) due to the convolutional effect of the confocal spot size. Consequently, the spacing between each structure (816) appears smaller.

Figure 8C:
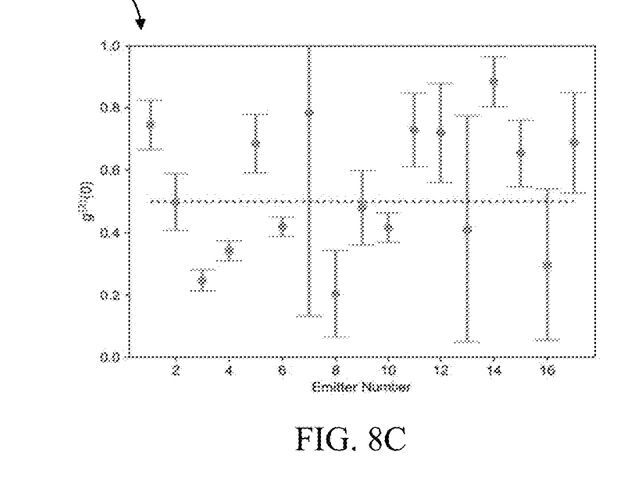
FIG. 8C depicts a summary of the $g(2)(\tau)$ values at zero delay time ($\tau=0$) from values retrieved from 17 different nanostructures of the first experimental setup, with the error bar showing the fit uncertainty.
Figure 8D:
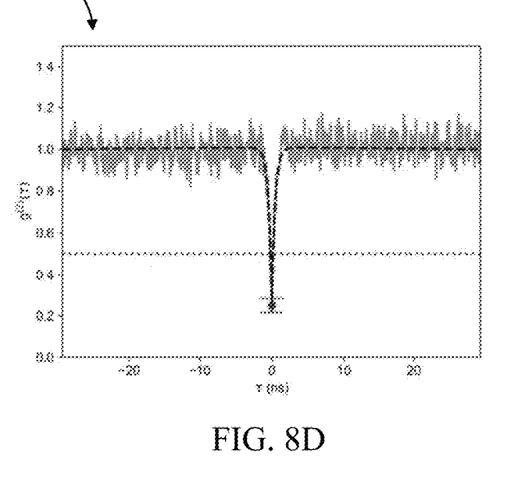
FIG. 8D depicts the antibunching curve from the second-order autocorrelation measurement corresponding to emitter 3 from FIG. 8C.

To assess the SPE-per-nanostructure yield and performance of the described methods, a row of emitters (804) may be selected and measured sequentially. This may be done to avoid bias in selection of the emitters (804) based on brightness which might artificially increase the fabrication yield, for example. To assess if a SPE is present, the $g(2)(\tau)$ value was obtained at zero delay time second order autocorrelation measurements may be taken on, for example, 17 different structures (804). However, second order autocorrelation measurements may be taken on any number of structures (804) as is desired. In one example of such measurements taken on 17 structures (804), autocorrelation measurements (830) can be seen in FIG. 8D. The measured autocorrelations can then be fitted with a standard 3-level model to estimate the $g(2)(0)$ value for each structure (804). A summary (820) of these results can be seen in FIG. 8C. Of the 17 emitters measured, nine have fitted $g(2)(0)$ values below 0.5, therefore indicating ~50% of all structures (804) measured have SPEs embedded in them, thus confirming the high yield of the methods described herein. Therefore, an exemplary process for large-scale high yield creation of SPEs in SiN on $SiO_2$ structures has been demonstrated. Additionally, these emitters may be fabricated with relatively high precision (e.g., ±85 nanometers).

In the described embodiments, SPEs are created at the $SiN/SiO_2$ interface. However, SPEs may also be created at a variety of interfaces such as a SiN/alumina interface, or at interfaces of other material combinations such as lithium niobate and silicon.

Reference systems that may be used herein can refer generally to various directions (for example, upper, lower, forward and rearward), which are merely offered to assist the reader in understanding the various embodiments of the disclosure and are not to be interpreted as limiting. Other reference systems may be used to describe various embodiments, such as those where directions are referenced to the portions of the device, for example, toward or away from a particular element, or in relations to the structure generally (for example, inwardly or outwardly).

While examples, one or more representative embodiments and specific forms of the disclosure have been illustrated and described in detail in the drawings and foregoing description, the same is to be considered as illustrative and not restrictive or limiting. The description of particular features in one embodiment does not imply that those particular features are necessarily limited to that one embodiment. Some or all of the features of one embodiment can be used in combination with some or all of the features of other embodiments as would be understood by one of ordinary skill in the art, whether or not explicitly described as such. One or more exemplary embodiments have been shown and described, and all changes and modifications that come within the spirit of the disclosure are desired to be protected.

The invention claimed is:

1. A method of fabricating a single photon emitting material, comprising:
   (a) interfacing a first material with a second material on a surface of a film stack, wherein the first material includes silicon nitride; and
   (b) energetically activating the interface by annealing the interface of the first material and the second material.

2. The method of claim 1, wherein the second material includes silicon dioxide.

3. The method of claim 1, comprising nanofabricating the first and second materials to form a nanostructure on the film stack, wherein the nanostructure is formed by portions of the first and second materials, wherein the nanostructure is configured to protrude in a direction away from the second material.

4. The method of claim 2, wherein interfacing the first material with the second material on the surface of the film stack includes growing the silicon nitride on the silicon dioxide.

5. The method of claim 3, wherein nanofabricating the first and second materials to form the nanostructure on the film stack includes:
   (a) positioning a resist layer over the silicon nitride;
   (b) opening a bore in the resist layer;
   (c) depositing an etch hardmask into the bore;
   (d) removing the resist layer and at least a first portion of the etch hardmask, leaving a second portion of etch hardmask to fill the bore;
   (e) ion etching around the second portion of the etch hardmask; and
   (f) removing the second portion of the etch hardmask to form the nanostructure.

6. A method of fabricating a single photon emitter, comprising:
   (a) forming a structure by interfacing a first material with a second material, wherein the first material includes silicon nitride; and
   (b) energetically activating the interface defined by the first material and second material to form a single photon emitter by annealing the structure.

7. The method of claim 6, wherein the second material includes silicon dioxide.

8. The method of claim 7, wherein interfacing the first material with the second material includes growing the silicon nitride on the silicon dioxide to form a film stack.

9. The method of claim 8, wherein growing the silicon nitride on the silicon dioxide includes performing one of a plasma-enhanced chemical vapor deposition (PECVD) process or a high-density plasma chemical vapor deposition (HDPCVD) process.

10. A method of fabricating a single photon emitter, comprising:
    (a) interfacing a first material with a second material to form a film stack, wherein the first material includes silicon nitride;
    (b) energetically activating the interface defined by the first material and second material by annealing the film stack; and
    (c) forming a structure from the film stack, wherein the structure is selectively operable as a single photon emitter.

11. The method of claim 10, wherein the second material includes silicon dioxide.

12. The method of claim 11, wherein interfacing the first material with the second material includes growing the silicon nitride on the silicon dioxide to form the film stack.

\* \* \* \* \*